(12) United States Patent
Eid et al.

(10) Patent No.: US 10,325,860 B2
(45) Date of Patent: Jun. 18, 2019

(54) MICROELECTRONIC BOND PADS HAVING INTEGRATED SPRING STRUCTURES

(71) Applicant: Intel Corporation, Santa Clara, CA (US)

(72) Inventors: Feras Eid, Chandler, AZ (US); Robert L. Sankman, Phoenix, AZ (US); Sandeep B. Sane, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 10 days.

(21) Appl. No.: 15/138,480

(22) Filed: Apr. 26, 2016

(65) Prior Publication Data

US 2017/0309578 A1    Oct. 26, 2017

(51) Int. Cl.
*H01L 23/498* (2006.01)
*H01L 23/00* (2006.01)
*H01L 21/48* (2006.01)

(52) U.S. Cl.
CPC .......... *H01L 23/562* (2013.01); *H01L 21/485* (2013.01); *H01L 21/4853* (2013.01);
(Continued)

(58) Field of Classification Search
CPC ........... H01L 23/5226; H01L 23/53228; H01L 23/53209; H01L 23/53266;
(Continued)

(56) References Cited

U.S. PATENT DOCUMENTS 8,836,118 B2  9/2014 Kang
9,297,824 B2  3/2016 Ma et al.
(Continued)

FOREIGN PATENT DOCUMENTS

KR   2013-0123747   11/2013

OTHER PUBLICATIONS

International Search Report and Written Opinion for International Patent Application No. PCT/US17/23114, dated Jul. 4, 2017.
(Continued)

*Primary Examiner* — Hoa B Trinh
(74) *Attorney, Agent, or Firm* — Green, Howard & Mughal LLP (57) ABSTRACT

A microelectronic package may be fabricated with at least one compliant external bond pad having at least one integrated spring structure for mitigating the effects of warpage of the microelectronic package during attachment to an external substrate. An embodiment for the microelectronic package may include a microelectronic package substrate having a first surface and an opposing second surface, wherein the microelectronic package substrate includes a void defined therein that extends into the microelectronic package substrate from the second surface thereof, and a compliant bond pad suspended over the void, wherein the compliant bond pad includes a land portion and at least one spring portion, and wherein the at least one spring portion extends from the compliant bond pad land portion to an anchor structure on the microelectronic package substrate second surface.

16 Claims, 10 Drawing Sheets

(52) U.S. Cl.
CPC .. *H01L 23/49816* (2013.01); *H01L 23/49838* (2013.01); *H01L 2224/16225* (2013.01); *H01L 2924/15311* (2013.01); *H01L 2924/3511* (2013.01)

(58) Field of Classification Search
CPC ......... H01L 23/49805; H01L 23/49827; H01L 23/49833
See application file for complete search history.

(56) References Cited

U.S. PATENT DOCUMENTS

| | | | |
|---|---|---|---|
| 2003/0153171 | A1 | 8/2003 | Kim |
| 2003/0201534 | A1 | 10/2003 | Eichelberger et al. |
| 2005/0146030 | A1 | 7/2005 | Miyazaki |
| 2007/0020916 | A1 | 1/2007 | Farnworth |
| 2011/0074024 | A1* | 3/2011 | Pendse .................. H01L 21/563 257/737 |
| 2014/0291843 | A1* | 10/2014 | Jiang ................ H01L 23/49816 257/738 |

OTHER PUBLICATIONS

International Preliminary Report on Patentability for International Patent Application No. PCT/US17/23114, dated Nov. 8, 2018.

* cited by examiner

MICROELECTRONIC BOND PADS HAVING INTEGRATED SPRING STRUCTURES

TECHNICAL FIELD

Embodiments of the present description generally relate to the field of microelectronic package fabrication, and, more particularly, to using bond pads having integrated spring structures within microelectronic package substrates to reduce the effects of warpage.

BACKGROUND

The microelectronic industry is continually striving to produce ever faster, smaller, and thinner microelectronic packages for use in various electronic products, including, but not limited to, computer server products and portable products, such as portable computers, electronic tablets, cellular phones, digital cameras, and the like.

Microelectronic packages generally include at least one microelectronic die attached to a microelectronic package substrate, such as an interposer. However, the microelectronic dice and the microelectronic package substrates, as well as other components within the microelectronic package, have differing coefficients of thermal expansion. The fundamental differences in the thermal expansion of these components may result in temperature dependent deformation or warpage of the microelectronic package, when the microelectronic package is being attached to an external substrate, such as a motherboard. This warpage may cause significant issues, such as non-contact opens, between the microelectronic package and the external substrate.

Such warpage can be mitigated by optimizing the microelectronic package architecture (e.g. modifying the stackup, increasing the microelectronic die or package size (footprint), increasing the microelectronic die or package thickness, and the like). However, these mitigation techniques may be restrictive when trying to integrate a higher degree of functionality at the package level, as will be understood to those skilled in the art. Another method may include attaching a stiffener to the microelectronic package. However, the use of a stiffener would increase the size of the microelectronic package in order to incorporate the same, which would be counter to the demand for ever smaller microelectronic packages and may increase the cost of the microelectronic package. As such, it is important to develop structures to mitigate warpage that will not restrict integration or increase the size of the microelectronic package.

BRIEF DESCRIPTION OF THE DRAWINGS

The subject matter of the present disclosure is particularly pointed out and distinctly claimed in the concluding portion of the specification. The foregoing and other features of the present disclosure will become more fully apparent from the following description and appended claims, taken in conjunction with the accompanying drawings. It is understood that the accompanying drawings depict only several embodiments in accordance with the present disclosure and are, therefore, not to be considered limiting of its scope. The disclosure will be described with additional specificity and detail through use of the accompanying drawings, such that the advantages of the present disclosure can be more readily ascertained, in which:

DESCRIPTION OF EMBODIMENTS

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. References within this specification to "one embodiment" or "an embodiment" mean that a particular feature, structure, or characteristic described in connection with the embodiment is included in at least one implementation encompassed within the present description. Therefore, the use of the phrase "one embodiment" or "in an embodiment" does not necessarily refer to the same embodiment. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and that elements depicted therein are not necessarily to scale with one another, rather individual elements may be enlarged or reduced in order to more easily comprehend the elements in the context of the present description.

The terms "over", "to", "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

Embodiments of the present description include a microelectronic package having at least one compliant external bond pad having integrated spring structures for mitigating the effects of warpage of the microelectronic package during attachment to an external substrate. An embodiment for the microelectronic package may include a microelectronic package substrate having a first surface and an opposing second surface, wherein the microelectronic package substrate includes a void defined therein that extends into the microelectronic package substrate from the second surface thereof, and a compliant bond pad suspended over the void, wherein the compliant bond pad includes a land portion and at least one spring portion, and wherein the at least one spring portion extends from the compliant bond pad land portion to an anchor structure on the microelectronic package substrate second surface.

Figure 1:
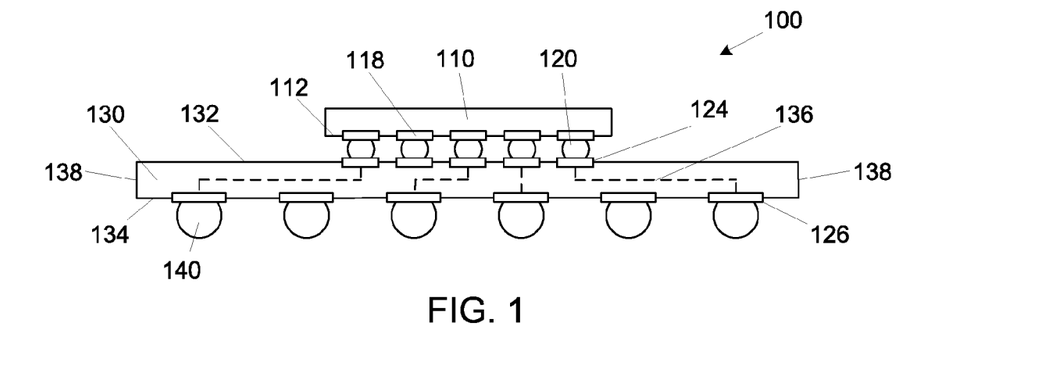
FIG. 1 is a side cross sectional view of a microelectronic die attached to a microelectronic package substrate to form a microelectronic package, according to an embodiment of the present description.

In FIG. 1, at least one microelectronic die 110, such as a microprocessor, a chipset, a graphics device, a wireless device, a memory device, an application specific integrated circuit, or the like, may be attached to a microelectronic package substrate 130, such as an interposer, through a plurality of interconnects 120 to form a microelectronic package 100. The interconnects 120 may extend between bond pads 118 on an active surface 112 of the microelectronic die 110 and corresponding bond pads 124 on a first surface 132 of the microelectronic package substrate 130, in a configuration generally known as a flip-chip or controlled collapse chip connection ("C4") configuration. The microelectronic die bond pads 118 may be in electrical communication with integrated circuitry (not shown) within the microelectronic die 110. The microelectronic package substrate bond pads 124 may be in electrical communication with conductive routes 136 within the microelectronic package substrate 130. The conductive routes 136 may provide electrical communication routes between the microelectronic die 110 on the microelectronic package substrate 130 and/or to other components (not shown), and may provide electrical communication routes to attachment bond pads 126 proximate a second surface 134 of the microelectronic package substrate 130 for attachment to a microelectronic board (not shown). External interconnects 140 may be attached to the attachment bond pads 126.

The microelectronic package substrate 130 may comprise any appropriate dielectric material, including, by not limited to, liquid crystal polymer, epoxy resin, bismaleimide triazine resin, FR4, polyimide materials, and the like. The conductive routes 136 may be formed of any appropriate conductive material, including, but not limited to, copper, silver, gold, nickel, and alloys thereof. It is understood that the microelectronic package substrate 130 may be formed from any number of dielectric layers and may contain active and/or passive microelectronic devices (not shown) formed therein. It is further understood that the conductive routes 136 could form any desired electrical route within the microelectronic package substrate 130 and/or with additional external components (not shown). It is also understood that solder resist layers (not shown) could be utilized on the microelectronic package substrate first surface 132 and/or the microelectronic package substrate second surface 134, as will be understood to those skilled in the art. The processes used for forming the microelectronic package substrate 130 are well known to those skilled in the art, and for the sake of brevity and conciseness will not be described or illustrated herein.

The microelectronic die interconnects 120 and the external interconnects 140 can be made from any appropriate material, including, but not limited to, solders and conductive filled epoxies. Solder materials may include any appropriate material, including but not limited to, lead/tin alloys, such as 63% tin/37% lead solder, or lead-free solders, such a pure tin or high tin content alloys (e.g. 90% or more tin), such as tin/bismuth, eutectic tin/silver, ternary tin/silver/copper, eutectic tin/copper, and similar alloys.

Figure 2:
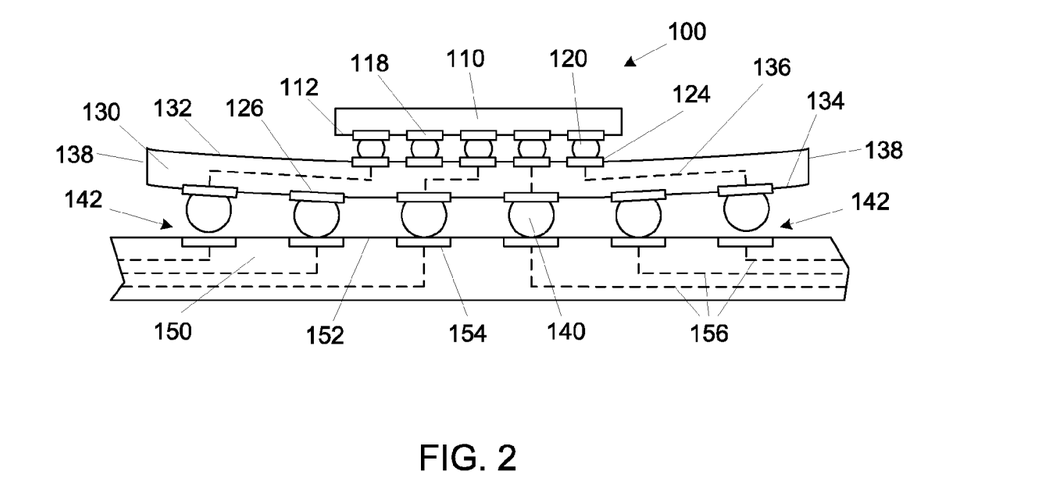
FIG. 2 is a side cross sectional view of a microelectronic package attached to an external substrate.

As shown in FIG. 2, the microelectronic package 100 may be attached to an external substrate 150, such as a motherboard, through the external interconnects 140. The external interconnects 140 may extend between the microelectronic package substrate attachment bond pads 126 and corresponding bond pads 154 on a first surface 152 of the external substrate 150, in a configuration generally known as a second level interconnect (SLI) configuration. The external substrate bond pads 154 may be in electrical communication with conductive routes 156 within the external substrate 150. The conductive routes 156 may provide electrical communication routes between the microelectronic package 100 and other components (not shown).

The external substrate 150 may comprise any appropriate dielectric material, including, by not limited to, liquid crystal polymer, epoxy resin, bismaleimide triazine resin, FR4, polyimide materials, and the like. The external substrate conductive routes 156 may be formed of any appropriate conductive material, including, but not limited to, copper, silver, gold, nickel, and alloys thereof. It is understood that the external substrate 150 may be formed from any number of dielectric layers and may contain active and/or passive microelectronic devices (not shown) formed therein. It is also understood that solder resist layers (not shown) could be utilized on the external substrate first surface 152. The processes used for forming the external substrate 150 are well known to those skilled in the art, and for the sake of brevity and conciseness will not be described or illustrated herein.

When the microelectronic package 100 is attached to the external substrate 150, the external interconnects 140 may be reflowed, such as by heat, to secure the external interconnects 140 between the microelectronic package substrate attachment bond pads 126 and the external substrate bond pads 154. This may result in the microelectronic package 100 warping, as shown in FIG. 2, due to differing coefficients of thermal expansion between the components of the microelectronic package 100, which may result in non-contact opens 142, wherein the external interconnects 140 may not adhere to their respective external substrate bond pads 154. Non-contact opens 142 may be of particular concern near edges 138 of the microelectronic package substrate 130 where the warpage may be more pronounced.

Figure 3:
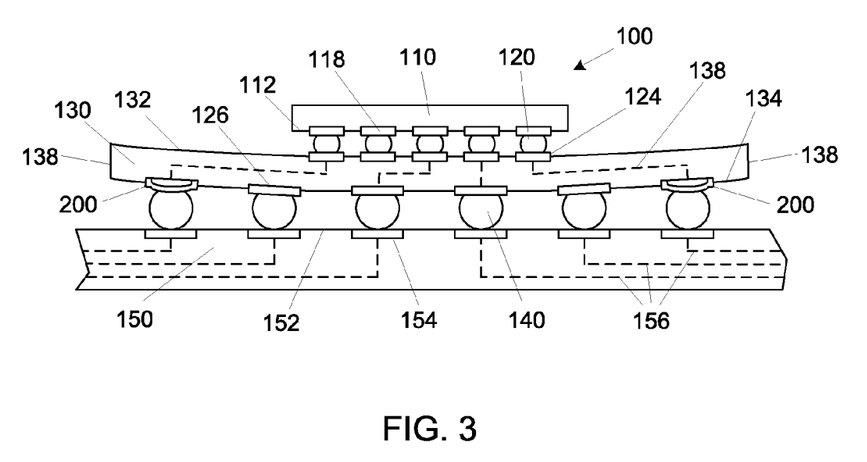
FIG. 3 is a side cross sectional view of a microelectronic package attached to an external substrate, wherein the microelectronic package includes a compliant bond pad, according to an embodiment of the present description.

In one embodiment of the present description, as shown in FIG. 3, at least one compliant bond pad 200 may be incorporated into the microelectronic package substrate 130. In an embodiment, as shown, at least one compliant bond pad 200 may be positioned adjacent at least one microelectronic package substrate edge 138. Thus, when the microelectronic package 100 experiences warpage during attachment to the external substrate 150, the compliant bond pad 200 can move or deflect, which allows the external interconnects 140 to remain connected to the microelectronic package substrate attachment bond pads 126 and the external substrate bond pads 154, even in areas of high warpage of the microelectronic package 100 relative to the external substrate 150. During attachment to the external substrate 150, the microelectronic package 100 may be taken from room temperature to a high reflow/melting temperature of the external interconnects 140 and then back to room temperature. The compliant bond pads 200 may enable the external interconnects 140 to contact the external substrate 150 during reflow at the reflow/melting temperature of the external interconnects 140 to make a connection that does not come apart as the temperature is raised and the microelectronic package 100 changes shape, e.g. warps. It is further understood, although not illustrated, that the microelectronic package 100 could be warped with a curvature opposite that shown in FIG. 3. In such an instance, the compliant bond pads 200 can flex into the microelectronic substrate 130 to allow the external contacts 140 form a connection between the microelectronic package substrate attachment bond pads 126 and the external substrate bond pads 154, where the spacing between the microelectronic package substrate 130 and the external substrate 150 would be greater.

Figure 4:
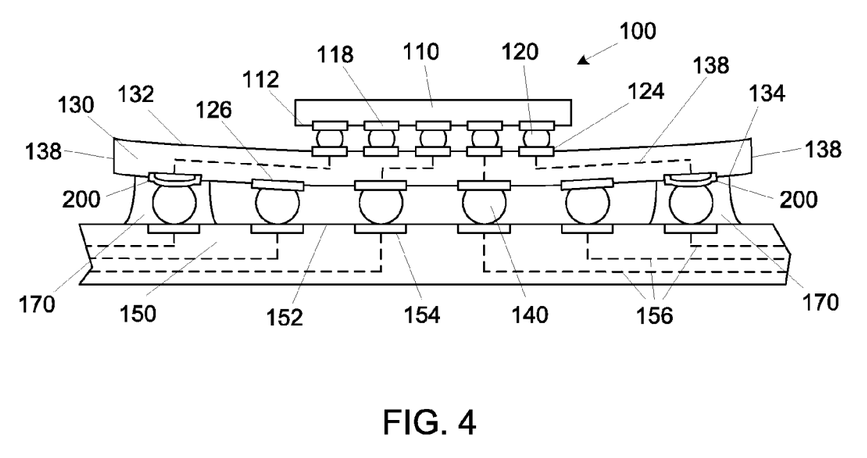
FIG. 4 is a side cross sectional view of a microelectronic package attached to an external substrate, wherein the microelectronic package includes a compliant bond pad, according to another embodiment of the present description.

As shown in FIG. 4, an adhesive material 170 may be applied to the compliant bond pads 200 after reflow to hold them in place and to improve reliability during subsequent temperature, humidity, shock tests, and the like, as will be understood to those skilled in the art.

Figure 5:
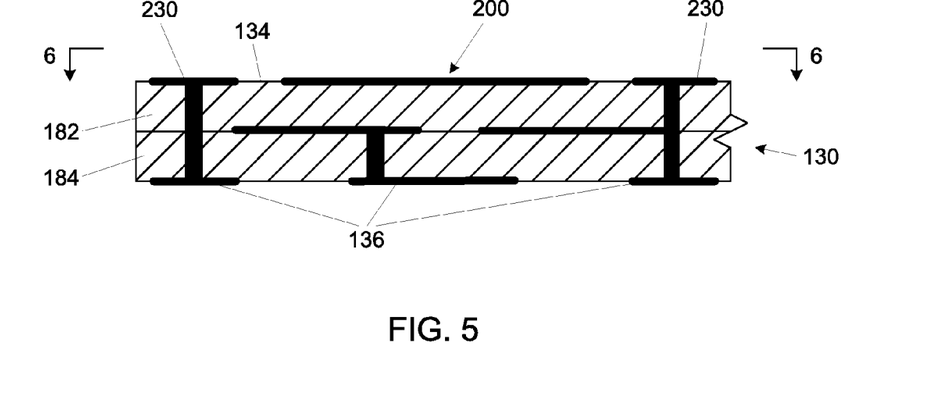
FIGS. 5-14 are cross sectional and plan views of forming a compliant bond pad for a microelectronic package substrate, according to an embodiment of the present description.
Figure 6:
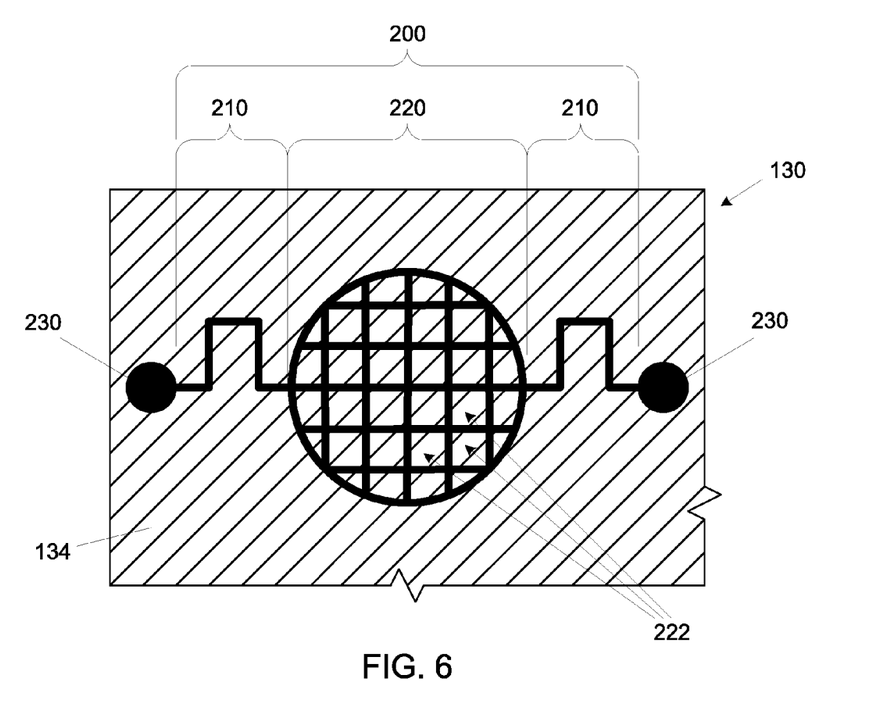

An embodiment for the fabrication of the compliant bond pad 200 is illustrated in FIGS. 5-14. As shown in FIGS. 5 (side cross-sectional view) and 6 (plan view along line 6-6 of FIG. 5), during the metallization process for the formation of the microelectronic package substrate attachment bond pads 126, a compliant bond pad 200 may be patterned on or in the second surface 134 of the microelectronic package substrate 130. As shown in FIG. 6, the at least one compliant bond pad 200 may include at least one spring portion 210 and a land portion 220. In one embodiment shown in FIG. 6, the at least one compliant bond pad spring portion 210 may extend between an anchor structure 230, which is a part of the conductive routes 136, and the compliant bond pad land portion 220. As further shown in FIG. 6, the at least one compliant bond pad spring portion 210 may not be linear between the anchor structure 230 and the compliant bond pad land portion 220, such that the compliant bond pad spring portion 210 may have a greater flex, as will be understood to those skilled in the art. As illustrated, the at least one compliant bond pad spring portion may comprise a plurality of linear segments. As still further shown in FIG. 6, the compliant bond pad land portion 220 may be substantially circular and have at least one opening 222 therethrough. Although the side cross-sectional view of FIG. 6 illustrates the microelectronic package substrate 130 as having two dielectric layers, e.g. first dielectric layer 182 and second dielectric layer 184 with components of the conductive routes 136 extending therethrough, the microelectronic package substrate 130 may have any appropriate number of dielectric layers.

Figure 7:
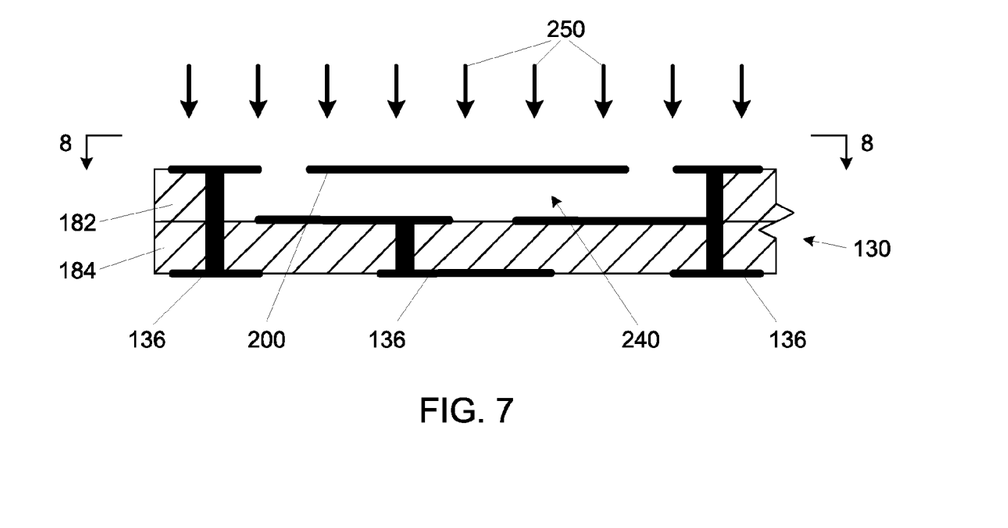
Figure 8:
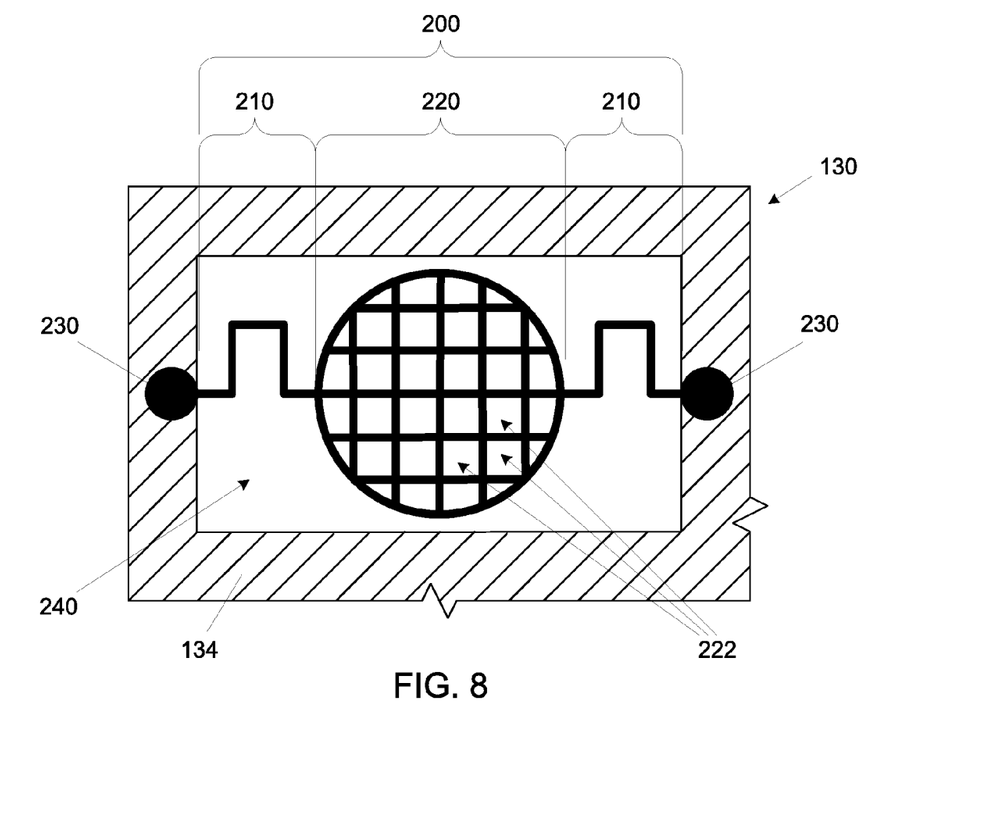

As shown in FIGS. 7 (side cross-sectional view) and 8 (plan view along line 8-8 of FIG. 7), a void 240 may be formed in the microelectronic package substrate 130 to suspend the compliant bond pad 200 over the void 240. In one embodiment, the void 240 may be formed by etching, such as reactive ion etching, illustrated with arrows 250 (for clarity and conciseness, the mask layer for the etching is not illustrated). It is noted that the openings 222 of the compliant bond pad land portion 220 may assist in exposing the microelectronic package substrate second surface 134 for etching. Furthermore, it is noted that structures beyond the plane of the views in FIGS. 7 and 8 are not illustrated for clarity.

Figure 9:
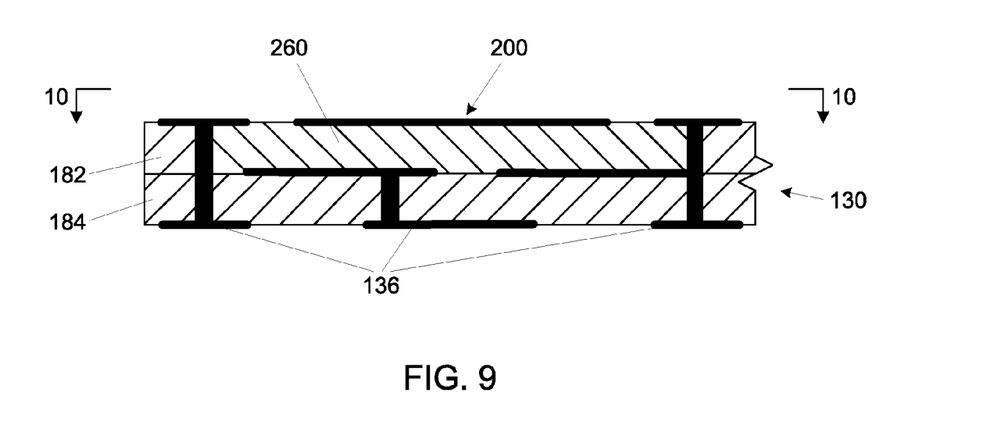
Figure 10:
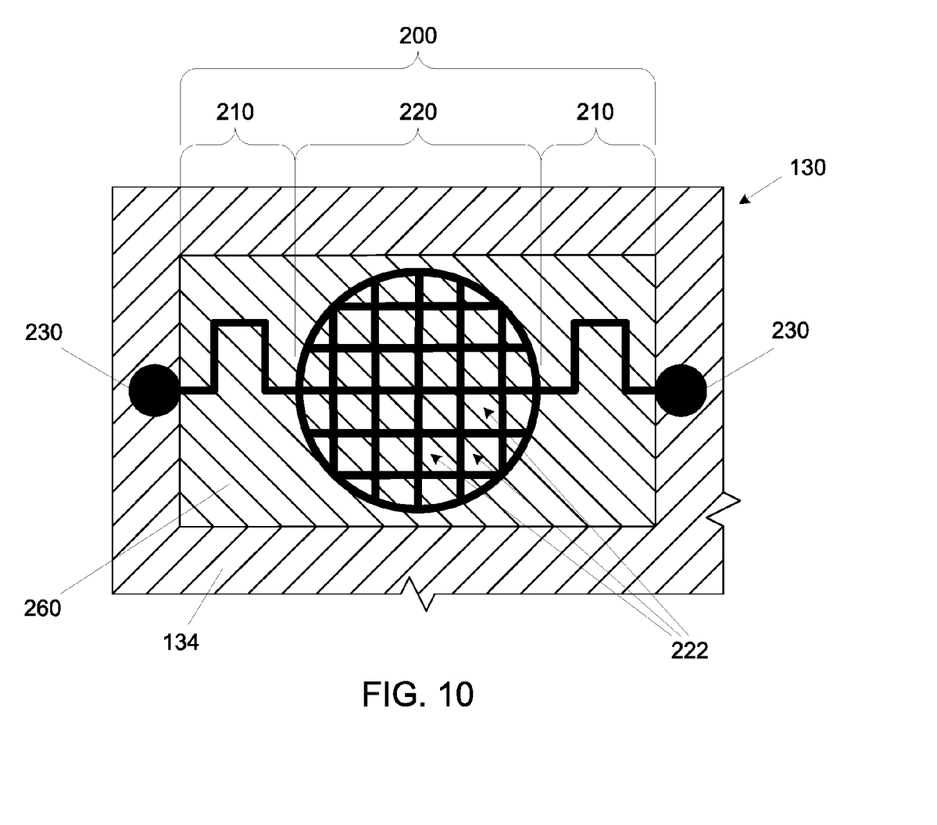

As shown in FIGS. 9 (side cross-sectional view) and 10 (plan view along line 10-10 of FIG. 9), the void 240 (see FIGS. 7 and 8) may be filled with a sacrificial material 260. The sacrificial material 260 may be any appropriate material, including, but not limited to, thermally decomposable materials and photo patternable materials. The processes used for forming the sacrificial material 260 are well known to those skilled in the art, and for the sake of brevity and conciseness will not be described or illustrated herein.

Figure 11:
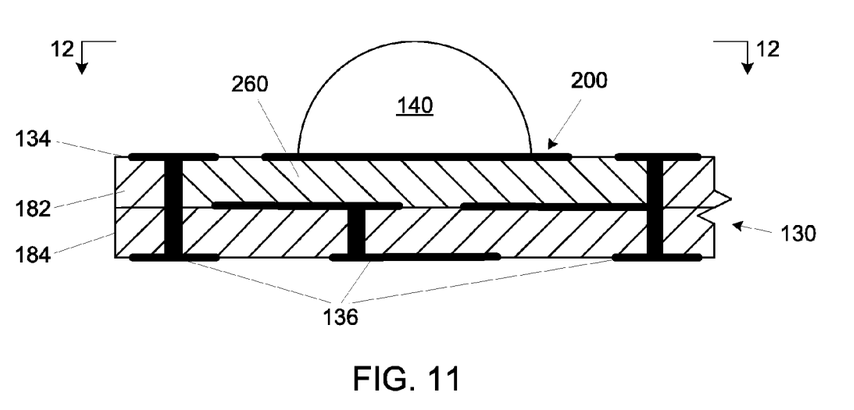
Figure 12:
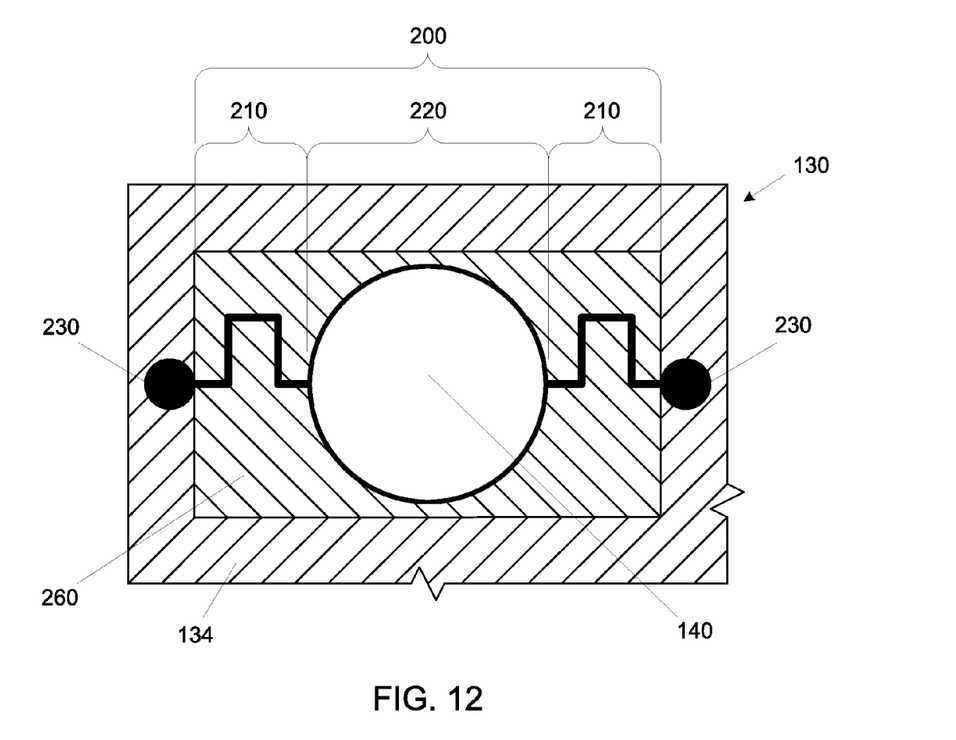

As shown in FIGS. 11 (side cross-sectional view) and 12 (plan view along line 12-12 of FIG. 11), the external interconnect 140 may be formed on the land portion 220 of the compliant bond pad 200. It is understood that the sacrificial material 260 supports the compliant bond pad 200 during the formation of the external interconnect 140. The processes used for forming the external interconnect 140 are well known to those skilled in the art, and for the sake of brevity and conciseness will not be described or illustrated herein.

Figure 13:
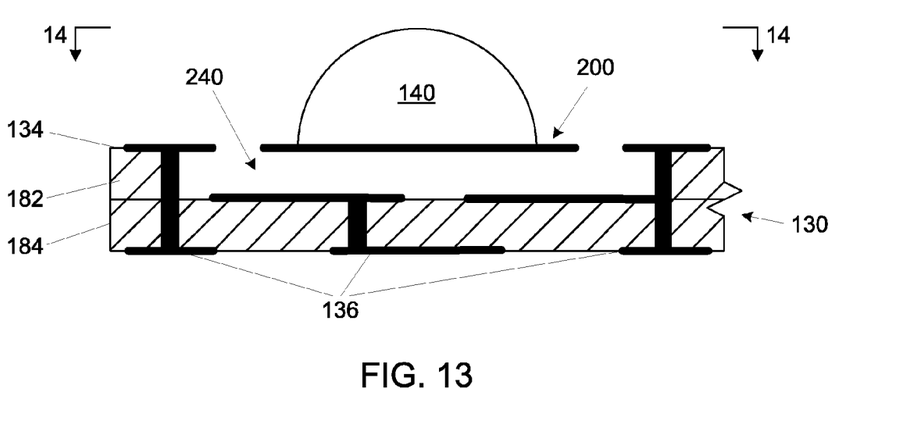

As shown in FIGS. 13 (side cross-sectional view) and 14 (plan view along line 14-14 of FIG. 13), the sacrificial material 260 (see FIGS. 11 and 12) may be removed to again form the void 240 in the microelectronic package substrate 130 to suspend the compliant bond pad 200 and the external interconnect 140 over the void 240. It is understood that the void 240 allows the spring portion 210 of the compliant bond pad 200 to flex. Furthermore, it is noted that structures beyond the plane of the views in FIGS. 13 and 14 are not illustrated for clarity.

Figure 14:
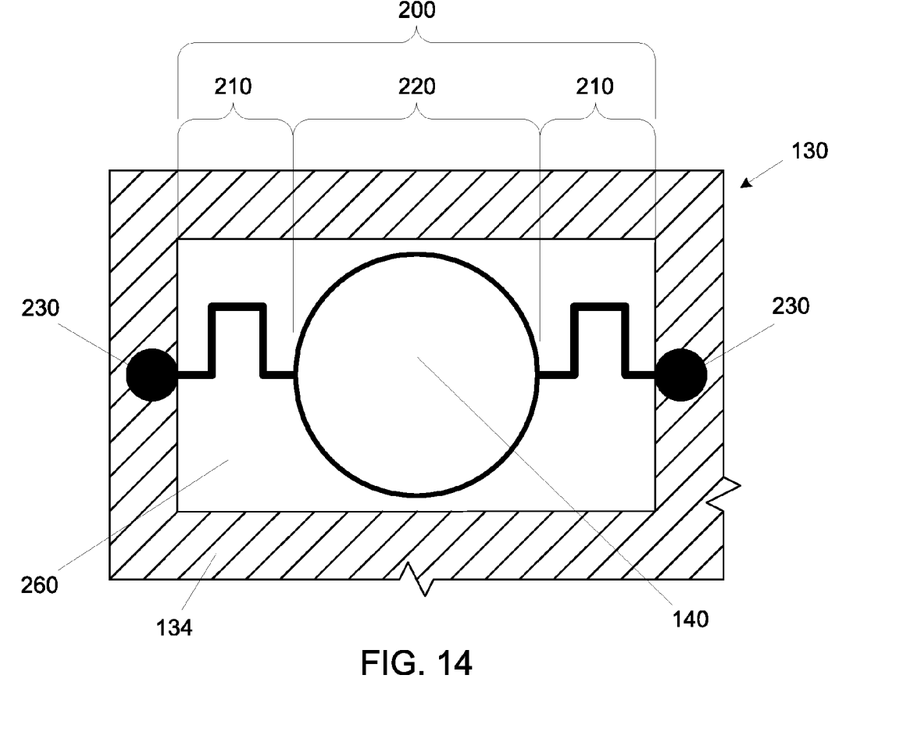
Figure 15:
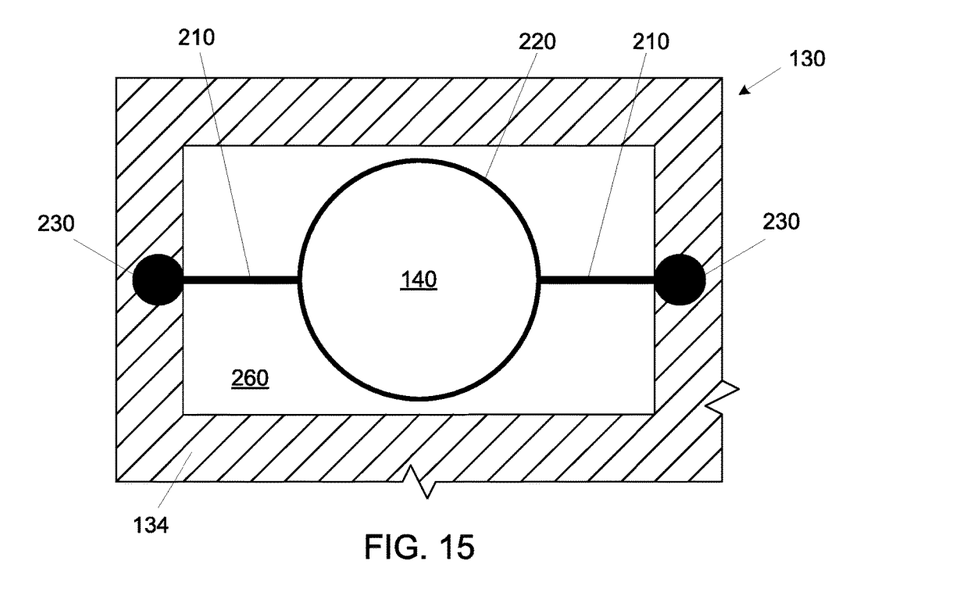
FIGS. 15-18 are plan views of compliant bond pads for microelectronic package substrates, according to embodiments of the present description.
Figure 16:
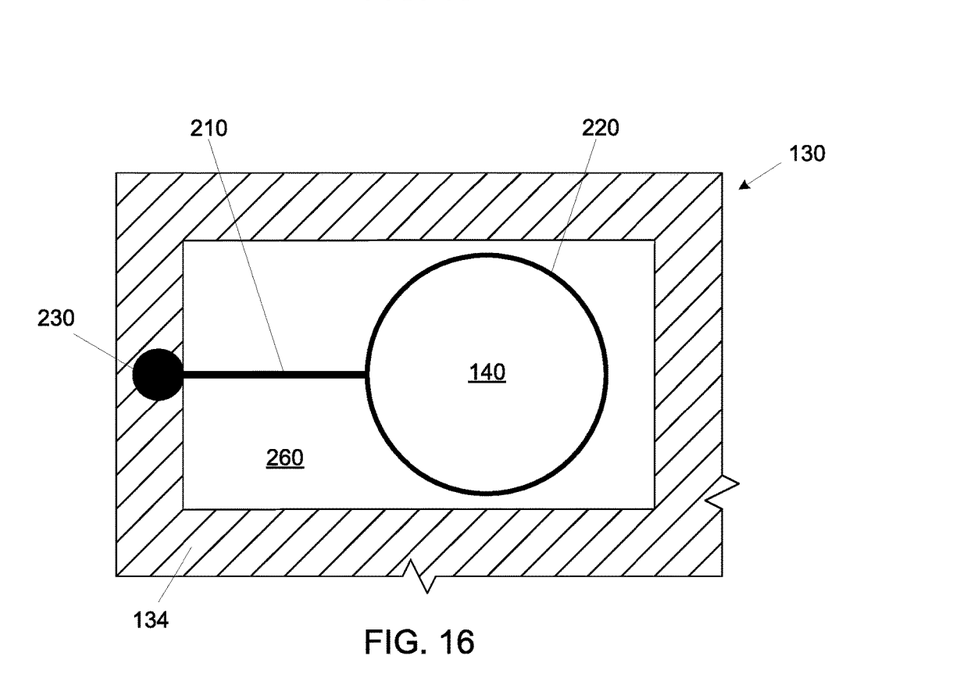
Figure 17:
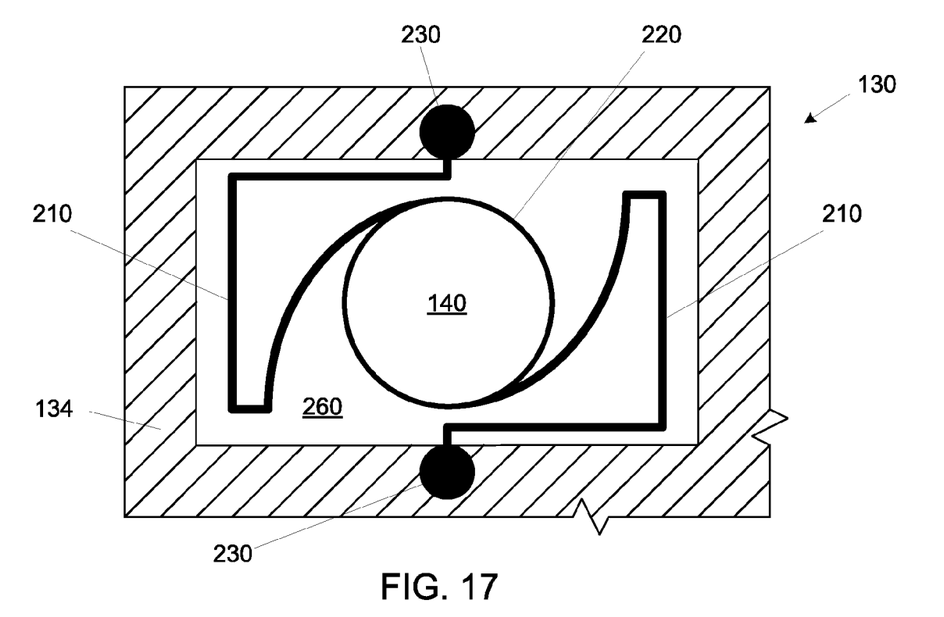
Figure 18:
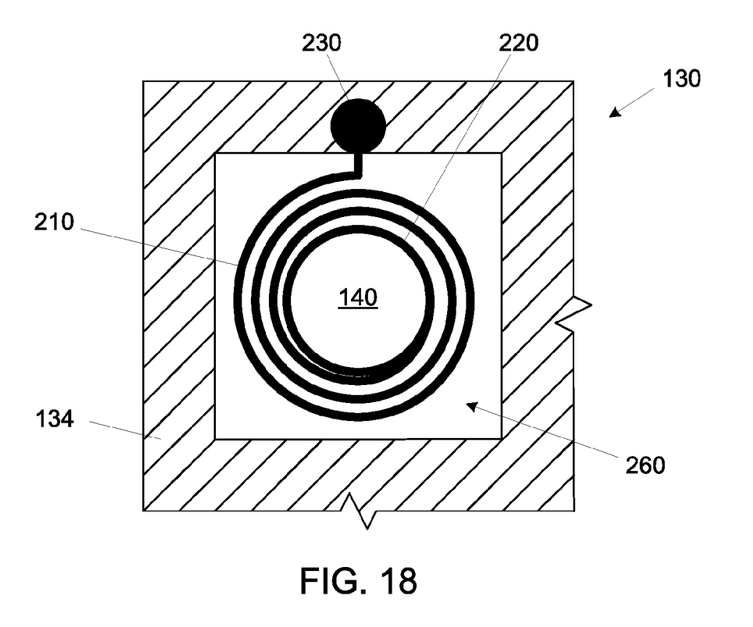

It is understood the subject matter of the present description is not limited to the specific compliant bond pad 200 illustrated in FIG. 14. The compliant bond pad 200 can have any appropriate structure, including, but not limited to, the compliant bond pads 200 shown in FIGS. 15-18. FIG. 15 illustrates an embodiment of the compliant bond pad 200, wherein the at least one spring portion 210 comprises an opposing pair of anchored linear beams. FIG. 16 illustrates an embodiment of the compliant bond pad 200, wherein the at least one compliant bond pad spring portion 210 comprises a single, anchored cantilever beam. FIG. 17 illustrates an embodiment of the compliant bond pad 200, wherein the at least one compliant bond pad spring portion 210 comprises an opposing pair of anchored beams having various linear and arcuate sections. FIG. 18 illustrates an embodiment of the compliant bond pad 200, wherein the at least one compliant bond pad spring portion 210 comprises an anchored spiral circling the land portion 220.

Figure 19:
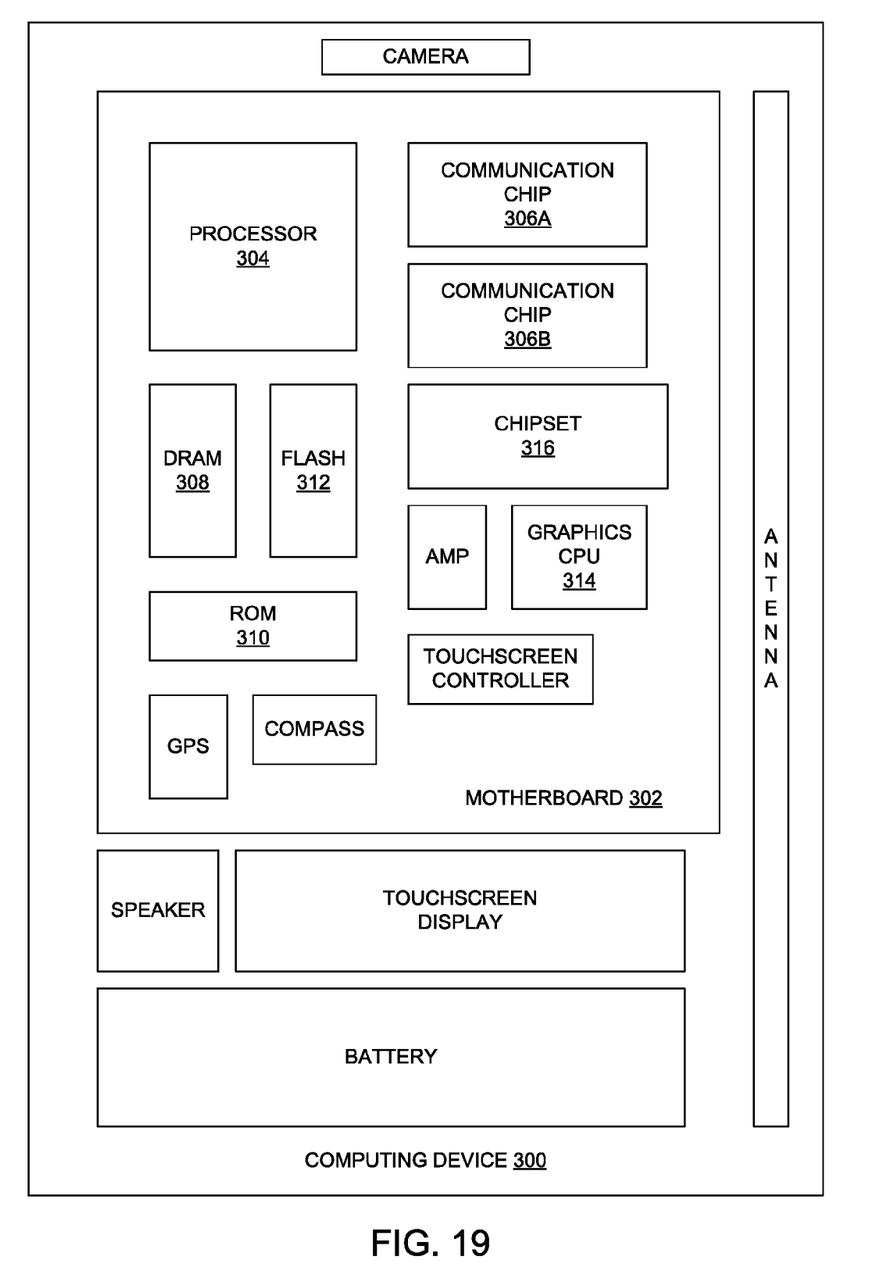
FIG. 19 illustrates a computing device in accordance with one implementation of the present description.

FIG. 19 illustrates a computing device 300 in accordance with one implementation of the present description. The computing device 300 houses a board 302, which may be analogous to external substrate 150 of FIG. 3. The board 302 may include a number of microelectronic components, including but not limited to a processor 304, at least one communication chip 306A, 306B, volatile memory 308, (e.g., DRAM), non-volatile memory 310 (e.g., ROM), flash memory 312, a graphics processor or CPU 314, a digital signal processor (not shown), a crypto processor (not shown), a chipset 416, an antenna, a display (touchscreen display), a touchscreen controller, a battery, an audio codec (not shown), a video codec (not shown), a power amplifier (AMP), a global positioning system (GPS) device, a compass, an accelerometer (not shown), a gyroscope (not shown), a speaker (not shown), a camera, and a mass storage device (not shown) (such as hard disk drive, compact disk (CD), digital versatile disk (DVD), and so forth). Any of the microelectronic components may be physically and electrically coupled to the board 302. In some implementations, at least one of the microelectronic components may be a part of the processor 304.

The communication chip enables wireless communications for the transfer of data to and from the computing device. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device may include a plurality of communication chips. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others.

The term "processor" may refer to any device or portion of a device that processes electronic data from registers and/or memory to transform that electronic data into other electronic data that may be stored in registers and/or memory.

Any of the microelectronic components within the computing device 300 may include a microelectronic package including a microelectronic package substrate including bond pads having integrated spring structures to reduce the effects of warpage, as described above.

In various implementations, the computing device may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device may be any other electronic device that processes data.

It is understood that the subject matter of the present description is not necessarily limited to specific applications illustrated in FIGS. 1-19. The subject matter may be applied to other microelectronic device and assembly applications, as will be understood to those skilled in the art.

The following examples pertain to further embodiments, wherein Example 1 is a microelectronic structure comprising a microelectronic package substrate having a first surface and an opposing second surface, wherein the microelectronic package substrate includes a void defined therein that extends into the microelectronic package substrate from the second surface thereof, and a compliant bond pad suspended over the void, wherein the compliant bond pad includes a land portion and at least one spring portion, and wherein the at least one spring portion extends from the compliant bond pad land portion to an anchor structure on the microelectronic package substrate second surface.

In Example 2, the subject matter of Example 1 can optionally include an external interconnect on the compliant bond pad land portion.

In Example 3, the subject matter of Example 2 can optionally include the external interconnect comprises solder.

In Example 4, the subject matter of Example 2 can optionally include an external substrate wherein the external interconnect is electrically connected to the external substrate.

In Example 5, the subject matter of Example 4 can optionally include the microelectronic package substrate being warped relative to the external substrate.

In Example 6, the subject matter of Example 4 can optionally include an adhesive material disposed on the compliant bond pad between the microelectronic package substrate and the external substrate.

In Example 7, the subject matter of any of Examples 1 to 6 can optionally include at least one microelectronic die electrically connected to the microelectronic package substrate first surface.

In Example 8, the subject matter of any of Examples 1 to 6 can optionally include the compliant bond pad land portion including a plurality of openings extending through the compliant bond pad land portion.

In Example 9, the subject matter of any of Examples 1 to 6 can optionally include the at least one compliant bond pad spring portion being non-linear.

In Example 10, the subject matter of any of Examples 1 to 6 can optionally include the at least one compliant bond pad spring portion comprising a spiral circling the compliant bond pad land portion.

The following examples pertain to further embodiments, wherein Example 11 is a method of fabricating a microelectronic structure comprising forming a microelectronic package substrate having a first surface and an opposing second surface; patterning a compliant bond pad and at least one anchor structure on or in the microelectronic package second surface, wherein the compliant bond pad includes a land portion and at least one spring portion, and wherein the at least one spring portion extends from the compliant bond pad land portion to the at least one anchor structure; and forming a void in the microelectronic package substrate, such that the compliant bond pad is suspended over the void.

In Example 12, the subject matter of Example 11 can optionally include filling the void with a sacrificial material, forming an external interconnect on the compliant bond pad land portion, and removing the sacrificial material.

In Example 13, the subject matter of Example 12 can optionally include forming the external interconnect comprising forming a solder external interconnect.

In Example 14, the subject matter of Example 13 can optionally include forming an external substrate and electrically connecting the external interconnect to the external substrate.

In Example 15, the subject matter of Example 14 can optionally include disposing an adhesive material on the compliant bond pad between the microelectronic package substrate and the external substrate.

In Example 16, the subject matter of any of Examples 11 to 15 can optionally include electrically connecting at least one microelectronic die to the microelectronic package substrate first surface.

In Example 17, the subject matter of any of Examples 11 to 15 can optionally include forming the compliant bond pad land portion which includes forming a plurality of openings extending through the compliant bond pad land portion.

In Example 18, the subject matter of any of Examples 11 to 15 can optionally include forming the at least one compliant bond pad spring portion which comprises forming a non-linear compliant bond pad spring portion.

In Example 19, the subject matter of any of Examples 11 to 15 can optionally include forming the at least one compliant bond pad spring portion which comprises forming a spiral circling the compliant bond pad land portion.

In Example 20, the subject matter of any of Examples 11 to 15 can optionally include forming the void comprising etching the microelectronic package substrate.

The following examples pertain to further embodiments, wherein Example 21 is a computing device, comprising a board; and a microelectronic package attached to the board, wherein the microelectronic package includes a microelectronic package substrate having a first surface and an opposing second surface, wherein the microelectronic package substrate includes a void defined therein that extends into the microelectronic package substrate from the second surface thereof; a compliant bond pad suspended over the void, wherein the compliant bond pad includes a land portion and at least one spring portion, and wherein the at least one spring portion extends from the compliant bond pad land portion to an anchor structure on the microelectronic package substrate second surface; and an external interconnect electrically connected between the compliant bond pad land portion and the board.

In Example 22, the subject matter of Example 21 can optionally include the external interconnect comprising solder.

In Example 23, the subject matter of Example 21 can optionally include the microelectronic package substrate being warped relative to the external substrate.

In Example 24, the subject matter of Example 21 can optionally include an adhesive material disposed on the compliant bond pad between the microelectronic package substrate and the external substrate.

In Example 25, the subject matter of any of Examples 21 to 24 can optionally include at least one microelectronic die electrically connected to the microelectronic package substrate first surface.

In Example 26, the subject matter of any of Examples 21 to 24 can optionally include the compliant bond pad land portion including a plurality of openings extending through the compliant bond pad land portion.

In Example 27, the subject matter of any of Examples 21 to 24 can optionally include the at least one compliant bond pad spring portion comprising a non-linear compliant bond pad spring portion.

In Example 28, the subject matter of any of Examples 21 to 24 can optionally include the at least one compliant bond pad spring portion comprising a spiral circling the compliant bond pad land portion.

Having thus described in detail embodiments of the present description, it is understood that the present description defined by the appended claims is not to be limited by particular details set forth in the above description, as many apparent variations thereof are possible without departing from the spirit or scope thereof.

What is claimed is:

1. A microelectronic structure, comprising:
   a microelectronic package substrate having a first surface and an opposing second surface, wherein the microelectronic package substrate includes a void defined therein that extends into the microelectronic package substrate from the second surface thereof; and
   a compliant bond pad suspended over the void, wherein the compliant bond pad includes a land portion and at least one spring portion, and wherein the at least one spring portion extends from the compliant bond pad land portion to an anchor structure on the microelectronic package substrate second surface; wherein the at least one spring portion only contacts the compliant bond pad land portion and the anchor structure and wherein the at least one compliant bond pad spring portion comprises a spiral circling the compliant bond pad land portion.

2. The microelectronic structure of claim 1, further comprising an external interconnect on the compliant bond pad land portion.

3. The microelectronic structure of claim 2, wherein the external interconnect comprises solder.

4. The microelectronic structure of claim 2, further comprising an external substrate wherein the external interconnect is electrically connected to the external substrate.

5. The microelectronic structure of claim 4, wherein the microelectronic package substrate is warped relative to the external substrate.

6. The microelectronic structure of claim 4, further comprising an adhesive material disposed on the compliant bond pad between the microelectronic package substrate and the external substrate.

7. The microelectronic structure of claim 1, further comprising at least one microelectronic die electrically connected to the microelectronic package substrate first surface.

8. The microelectronic structure of claim 1, wherein the compliant bond pad land portion includes a plurality of openings extending through the compliant bond pad land portion.

9. The microelectronic structure of claim 1, wherein the at least one compliant bond pad spring portion is non-linear.

10. A computing device, comprising:
    a board; and
    a microelectronic package attached to the board, wherein the microelectronic package includes:
    a microelectronic package substrate having a first surface and an opposing second surface, wherein the microelectronic package substrate includes a void defined therein that extends into the microelectronic package substrate from the second surface thereof;
    a compliant bond pad suspended over the void, wherein the compliant bond pad includes a land portion and at least one spring portion, wherein the at least one spring portion extends from the compliant bond pad land portion to an anchor structure on the microelectronic package substrate second surface, wherein the at least one compliant bond pad spring portion comprises a spiral circling the compliant bond pad land portion, and wherein the at least one spring portion only contacts the compliant bond pad land portion and the anchor structure; and
    an external interconnect electrically connected between the compliant bond pad land portion and the board.

11. The computing device of claim 10, wherein the external interconnect comprises solder.

12. The computing device of claim 10, further comprising an adhesive material disposed on the compliant bond pad between the microelectronic package substrate and the external substrate.

13. The computing device of claim 10, further comprising at least one microelectronic die electrically connected to the microelectronic package substrate first surface.

14. The computing device of claim 10, wherein the compliant bond pad land portion includes a plurality of openings extending through the compliant bond pad land portion.

15. The computing device of claim 10, wherein the microelectronic package substrate is warped relative to the external substrate.

16. The computing device of claim 10, wherein the at least one compliant bond pad spring portion is non-linear.

* * * * *